(12) United States Patent
Gates

(10) Patent No.: US 6,178,088 B1
(45) Date of Patent: Jan. 23, 2001

(54) ELECTRONIC APPARATUS

(75) Inventor: William George Gates, Wolverton (GB)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/235,795

(22) Filed: Jan. 22, 1999

(30) Foreign Application Priority Data

Jan. 27, 1998 (EP) .................................................. 98300550

(51) Int. Cl.$^7$ ....................................................... H05K 7/20
(52) U.S. Cl. .......................... 361/699; 361/698; 361/700; 174/15.2; 165/80.4; 165/104.33
(58) Field of Search .................... 361/689, 687, 361/688, 699, 700, 704, 719, 715; 257/714, 715; 174/15.2; 165/80.4, 104.33

(56) References Cited

U.S. PATENT DOCUMENTS

| | | | |
|---|---|---|---|
| 4,012,089 | 3/1977 | Ward | 312/236 |
| 4,963,833 * | 10/1990 | Mountz | 330/65 |
| 5,409,055 * | 4/1995 | Tanaka et al. | 165/104.33 |
| 5,508,908 * | 4/1996 | Kazama et al. | 165/80.3 |
| 5,513,070 * | 4/1996 | Xie et al. | 361/700 |
| 5,587,880 | 12/1996 | Phillips et al. | 361/687 |
| 5,841,244 * | 11/1998 | Hamilton et al. | 361/700 |
| 5,930,115 * | 7/1999 | Tracy et al. | 361/704 |
| 5,933,323 * | 8/1999 | Bhatia et al. | 361/700 |
| 5,949,648 * | 9/1999 | Liao | 361/700 |
| 5,959,837 * | 9/1999 | Yu | 361/697 |
| 5,969,940 * | 10/1999 | Sano et al. | 361/687 |
| 5,982,616 * | 11/1999 | Moore | 361/687 |

FOREIGN PATENT DOCUMENTS

| | | | | |
|---|---|---|---|---|
| 0 541 823 A1 * | 5/1993 | (EP) | | F28D/15/02 |
| 2533364 | 3/1984 | (FR) | | H01J/7/24 |
| 4 031 374 94A * | 6/1991 | (JP) | | F28D/15/02 |
| 07115281 | 5/1995 | (JP) | | H05K/3/46 |
| 07283564 | 10/1995 | (JP) | | H05K/7/20 |

OTHER PUBLICATIONS

European Search Report dated Jul. 2, 1998.

* cited by examiner

*Primary Examiner*—Leo P. Picard
*Assistant Examiner*—Boris L. Chervinsky

(57) ABSTRACT

An electronic apparatus having a heat pipe that is thermally bonded to plates to internal and external enclosures. The electronic apparatus is located in a heat dissipative external enclosure. The electronic apparatus having at least one unit contained in a thermally conductive internal housing providing RF isolation and mounted on a wall of the external enclosure in thermal contact therewith. The electronic apparatus also having a heat pipe having a first plate bonded to its evaporator and a second plate bonded to its condenser, both bonds being thermally conductive. The first plate being mounted by fixings in thermal contact with the internal housing, the second plate being mounted by fixings in thermal contact with the wall of the external enclosure at a position lower, in use, than the first plate. This allows the heat pipe to be easily removed. This also allows the inner housing to maintain RF isolation.

3 Claims, 2 Drawing Sheets

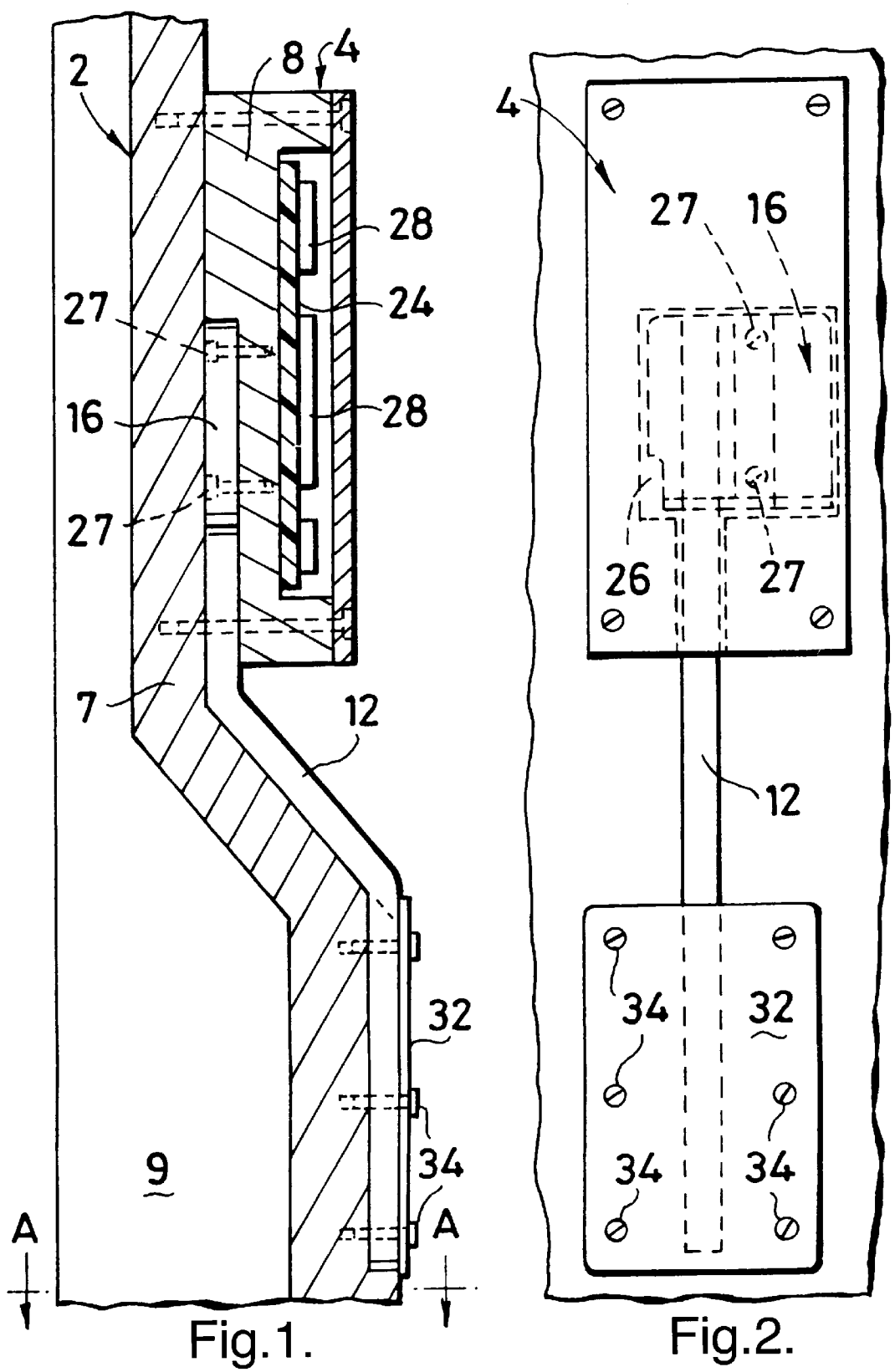

ELECTRONIC APPARATUS

CROSS-REFERENCE TO RELATED APPLICATION

This application claims priority of European Patent Application No. 98300550.5, which was filed on Jan. 27, 1998.

FIELD OF THE INVENTION

This invention relates to electronic apparatus contained in a heat dissipative external enclosure.

BACKGROUND OF THE INVENTION

In the absence of forced convection, an electronic apparatus will be hotter at the top of its external enclosure than at the bottom. The situation is worse for apparatus sealed for use outside where internally generated heat has to be dissipated by the external enclosure. Ideally components which generate large amounts of heat would be sited lower in the external enclosure than components which generate less heat. However, that is not always possible.

Heat pipes have been used to conduct heat away from components to cooler positions in the external enclosure. Conventionally, the evaporator of a heat pipe is in direct thermal contact with a power component e.g. by clamping or bonding. The condenser of the heat pipe is conventionally pressed into a groove in the wall of the external enclosure, being an interference fit in the groove so as to ensure good thermal contact. The heat pipe has a round cross section and the groove has a corresponding round bottom. The step of pressing the heat pipe into the groove may also be used to distort the pipe so that it finishes flush with the top of the groove.

A problem with this is that removal of the heat pipe is virtually impossible which makes removal of the circuit board on which the component is mounted very difficult.

In some external enclosures individual units have to be isolated from one another against radio frequency (RF) interference by closed internal housings. Another problem with using the heat pipe as described above is that it would be difficult to maintain the RF isolation around a heat pipe that would have to enter the internal housing.

SUMMARY OF THE INVENTION

The invention solves the above problems by providing an electronic apparatus having a heat pipe that is thermally bonded to plates to internal and external enclosures. The electronic apparatus is located in a heat dissipative external enclosure. The electronic apparatus having at least one unit contained in a thermally conductive internal housing providing RF isolation and mounted on a wall of the external enclosure in thermal contact therewith. The electronic apparatus also having a heat pipe having a first plate bonded to its evaporator and a second plate bonded to its condenser, both bonds being thermally conductive. The first plate being mounted by fixings in thermal contact with the internal housing, the second plate being mounted by fixings in thermal contact with the wall of the external enclosure at a position lower, in use, than the first plate. This allows the heat pipe to be easily removed. This also allows the inner housing to maintain RF isolation.

For best effect, the first plate is preferably located adjacent one or more power components inside the internal housing. The first plate is preferably mounted in a recess in the internal housing.

BRIEF DESCRIPTION OF THE DRAWINGS

One embodiment of the invention will now be described, by way of example, with reference to the accompanying drawings, in which:

FIG. 1 is a cross section through part of electronic apparatus showing an internal housing mounted on a wall of an external enclosure;

FIG. 2 is a side view of the cross section of the electronic apparatus of FIG. 1;

DETAILED DESCRIPTION

Figure 3:
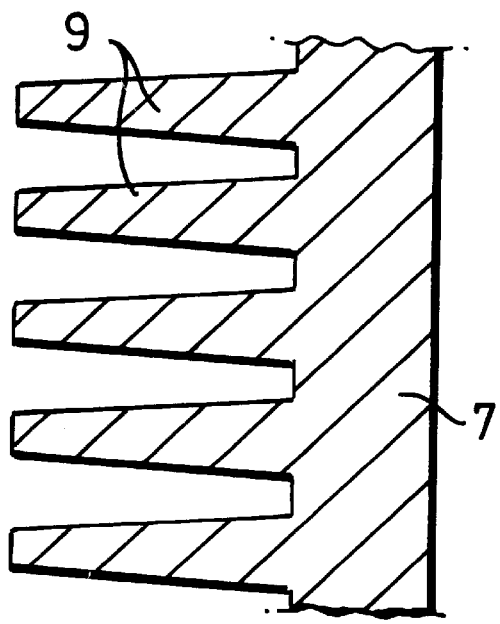
FIG. 3 is a cross section of the electronic apparatus of FIG. 1 on arrows A—A.

Referring to FIG. 1, a base station of a mobile communications network has electronic apparatus mounted in external enclosure 2, only part of which is shown in the drawings. The enclosure contains, amongst other units, a unit that generates a relatively large amount of heat, such as wide band power amplifier 4. Wide band power amplifier 4 is contained in an aluminum internal housing 8 to provide RF isolation. The internal units, including power amplifier 4 are mounted in thermal contact with wall 7 of enclosure 2. Enclosure 2 is manufactured from light metal and has extended surfaces or fins 9, as shown in FIGS. 1 and 3, so as to dissipate heat generated by its internal units including power amplifier 4.

Enclosure 2 is environmentally sealed. Convection within the enclosure is not possible due to very small internal spaces left by the units contained therein. Convection around the external enclosure is not forced so the top of the enclosure is hotter significantly than the bottom. It would be better for heat dissipation to locate the power amplifier low in the external enclosure in a lower temperature because power amplifier 4 generates a relatively large amount of heat. However, other design constraints require power amplifier 4 to be located higher than desirable.

Figure 4:
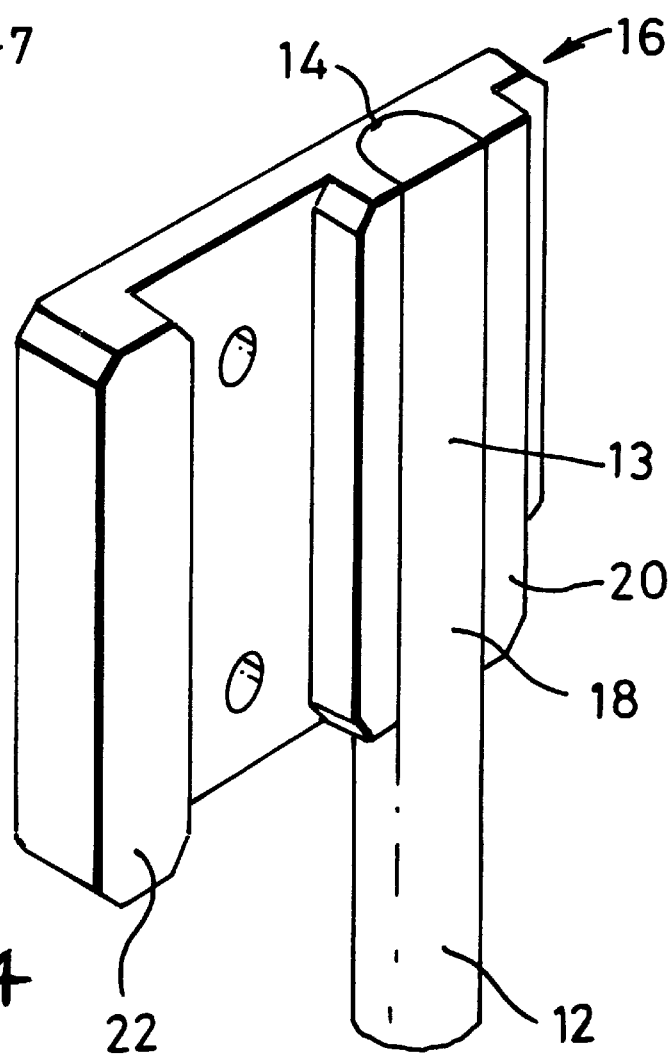
FIG. 4 is a perspective view of the evaporator of the heat pipe with its associated pipe.

Referring to FIG. 4, in order to reduce the temperature of power amplifier 4, heat pipe 12 is provided. Evaporator 13 of heat pipe 12 is received by recess 14 in heat conductive plate 16 made of heat conductive material, such as copper for example. Heat pipe 12 is bonded to the plate by pressing it into the recess to give a generally flat surface which is then machined flat with the surrounding land 20 and with land 22 spaced therefrom. Heat transfer between evaporator 13 and plate 16 may be enhanced by welding, brazing, soldering, or bonding the two with a heat conducting cement, such as epoxy resin, for example.

Referring concurrently to FIGS. 1, 2, and 4, inside housing 8, components are mounted on circuit board 24. Plate 16 is located in recess 26 with flat surfaces of evaporator 13, and surronding land 20 adjacent to power components 28, such as output transistors, which dissipate large amounts of heat. Plate 16 is mounted in thermal contact with the bottom of recess 26 by screws 27. Land 22 stabilizes the plate laterally.

Condenser 30 of heat pipe 12 is bonded to heat conductive plate 32 e.g. by welding, brazing, soldering, or bonding with a heat conducting cement, such as epoxy resin, for example. The plate is secured in thermal contact with wall 7 by screws 34.

Heat is conducted by the heat pipe from power amplifier 4 to a cooler lower section of the external enclosure.

While the invention has been described with reference to a preferred embodiment, it will be understood by those skilled in the art having reference to the specification and drawings that various modifications may be made and various alternatives are possible therein without departing from the spirit and scope of the invention.

I claim:

1. Electronic apparatus contained in a heat dissipative external enclosure, the electronic apparatus comprising:

at least one unit located in the external enclosure;

a thermally conductive internal housing providing RF isolation and mounted on a wall of the external enclosure in thermal contact therewith, the unit being located in the housing;

a heat pipe having a first plate bonded to its evaporator and a second plate bonded to its condenser, both bonds being thermally conductive, the first plate being mounted by fixings in thermal contact with the internal housing, the first plate being mounted in a recess of the interior housing and being disposed between the external enclosure and the interior housing, the second plate being mounted by fixings in thermal contact with the wall of the external enclosure at a position lower, in use, than the first plate.

2. Electronic apparatus as claimed in claim 1, wherein the first plate is located adjacent one or more power components inside the internal housing.

3. Electronic apparatus as claimed in claim 1, wherein the fixings comprise screws.

* * * * *